(12) United States Patent
Standing

(10) Patent No.: US 7,592,688 B2
(45) Date of Patent: Sep. 22, 2009

(54) SEMICONDUCTOR PACKAGE

(75) Inventor: Martin Standing, Tonbridge (GB)

(73) Assignee: International Rectifier Corporation, El Segundo, CA (US)

( * ) Notice: Subject to any disclaimer, the term of this patent is extended or adjusted under 35 U.S.C. 154(b) by 97 days.

(21) Appl. No.: 11/653,579

(22) Filed: Jan. 16, 2007

(65) Prior Publication Data

US 2007/0164423 A1    Jul. 19, 2007

Related U.S. Application Data

(60) Provisional application No. 60/758,764, filed on Jan. 13, 2006.

(51) Int. Cl.
*H01L 23/02*    (2006.01)

(52) U.S. Cl. .................. 257/678; 257/724; 257/725; 257/726; 257/719

(58) Field of Classification Search ............... 257/668, 257/728, 678, 724, 725, 726, 719
See application file for complete search history.

(56) References Cited

U.S. PATENT DOCUMENTS

2004/0119148 A1 *  6/2004  Standing .................... 257/668
2006/0263584 A1 * 11/2006  Schulz-Harder et al. . 428/292.1

FOREIGN PATENT DOCUMENTS

WO    WO2004102659    * 11/2004

* cited by examiner

*Primary Examiner*—Marcos D. Pizarro
*Assistant Examiner*—Eva Y. Montalvo
(74) *Attorney, Agent, or Firm*—Farjami & Farjami LLP

(57) ABSTRACT

A multi-chip semiconductor package that includes two power semiconductor devices arranged in a half-bridge configuration between two opposing circuit boards.

15 Claims, 10 Drawing Sheets

SEMICONDUCTOR PACKAGE

RELATED APPLICATION

This application is based on and claims priority to the U.S. Provisional Application Ser. No. 60/758,764, filed on Jan. 13, 2006, entitled Semiconductor Package, to which a claim of priority is hereby made and the disclosure of which is incorporated by reference.

BACKGROUND OF THE INVENTION

To integrate a semiconductor component into an electronic circuit, the component must be packaged. FIG. 1 shows the cross-section of a typical, multi-chip package 5, which includes substrate 6, semiconductor components 7, and molded housing 8. It should be noted that semiconductor components are interconnected inside the package and to external connectors (not shown) by connectors such as bond wires 9A and in some cases conductive clips, e.g. 9B.

Such semiconductors add to the overall resistance and inductance of the package, and cause undesirable effects such as ringing.

Furthermore, if the package contains heat generating components, in a conventional package such as package 5, a heatsink (not shown) may be thermally coupled to substrate 6 to dissipate the generated heat. The size of the heatsink typically depends on the amount of heat generated. Thus, a large amount of heat would require a larger heatsink. Therefore, heat generation has a bearing on the size of the package.

U.S. Pat. No. 7,045,884, which is assigned to the assignee of the present invention disclosed a package which overcomes the drawbacks of the prior art as set forth above. Referring to FIG. 2, semiconductor package 10 according to U.S. Pat. No. 7,045,884 includes first circuit board 12, and second circuit board 14 which is assembled over first circuit board 12. Circuit boards 12, 14 are of the thermally conductive variety such as insulated metal substrate (IMS), or Direct-bonded copper (DBC). Such circuit boards include a thermally conductive, but electrically insulating body which can have conductive patterns formed over at least one of its surfaces. In the one disclosed embodiment, first circuit board 12 includes a plurality of external connectors 16 which serve as input and output connectors to the elements disposed between first circuit board 12 and second circuit board 14.

Referring next to FIG. 3, semiconductor package 10 includes a plurality of power MOSFETs $T_1, T_2, T_3, T_4, T_5, T_6$ which are interconnected to form three parallel-connected half-bridge circuits, each for driving a respective phase of a three-phase motor.

As is well known in the art, each half-bridge circuit includes a high side MOSFET, $T_3, T_2, T_1$ and a low side MOSFET $T_4, T_5, T_6$. When power MOSFETs are used to form half-bridge circuits, the source contact of the high side MOSFET, e.g. $T_1$, is series connected to the drain contact of the low side MOSFET e.g. $T_6$, while the drain contact of the high side MOSFET is connected to the input power $V_+$ and the source contact of the low side MOSFET is connected to the ground G. Referring to FIG. 3, in the first embodiment of the present invention MOSFET $T_3$, forms a half-bridge with MOSFET $T_4$, MOSFET $T_2$ forms a half-bridge with MOSFET $T_5$, and MOSFET $T_1$ forms a half-bridge with MOSFET $T_6$. As is well known the output of each half-bridge circuit A, B, C is taken from the connection point of its high side MOSFET to its respective low side MOSFET as shown by FIG. 3. To operate each MOSFET $T_1, T_2, T_3, T_4, T_5, T_6$, a gate signal is sent by a control circuit (not shown) through a respective gate connection $G_1, G_2, G_3, G_4, G_5, G_6$.

Referring now to FIG. 4, first circuit board 12 includes a plurality of source conductive pads $18_{T1}, 18_{T2}, 18_{T3}$ for receiving source contacts of high side MOSFETS $T_1, T_2, T_3$, respectively, and drain conductive pads $20_{T6}, 20_{T5}, 20_{T4}$ for receiving the drain contacts of low side MOSFETs $T_6, T_5, T_4$, respectively. Each conductive pad is an area on a conductive track which has been exposed through an opening in a solder passivation layer formed on the conductive track. The conductive track is itself disposed on the thermally conductive body of a circuit board 12, 14. Specifically, each conductive track is a layer of conductive material, such as copper or aluminum, which is patterned to a desired configuration. Conductive tracks are covered with solder passivation material, and openings are formed in the solder passivation material to expose portions of the conductive tracks to serve as conductive pads.

Source conductive pad $18_{T1}$ is connected electrically through a conductive trace 22 on circuit board 12 to conductive pad $20_{T6}$, and then connected to external connector $16_A$ through another conductive trace 22 on circuit board 12. Each conductive trace 22 is essentially a portion of the conductive track which electrically connects conductive pads together or to an external connection. Specifically, for example, as will be shown, source conductive pad $18_{T1}$, drain conductive pad $20_{T2}$, and traces 22, and external connector $16_A$ form a conductive track that provides an output connection for the half-bridge circuit that is formed by MOSFETs $T_1$ and $T_6$.

Conductive pads $18_{T2}$, and $18_{T3}$ are similarly connected to conductive pads $20_{T5}$ and $20_{T4}$ and then to external connectors $16_B$ and $16_C$ in a similar manner. As a result, source contacts of high side MOSFETs $T_1, T_2, T_3$ are electrically connected to drain contacts of respective low side MOSFETs $T_6, T_5, T_4$ and then connected to external connectors $16_A, 16_B, 16_C$, which serve as output connections for each half-bridge circuit without using any wirebonds.

First circuit board 12 also includes gate conductive pads $24_{T1}, 24_{T2}, 24_{T3}$ each for receiving a respective gate contact of high side MOSFETs $T_1, T_2, T_3$. Gate conductive pad $24_{T1}$ is connected via a trace 22 to external connector $16_{G1}$, which serves as the gate connection for receiving a gate signal for high side MOSFET $T_1$. Similarly, gate pads $24_{T2}$ and $24_{T3}$ are connected to output connectors $16_{G2}$ and $16_{G3}$ respectively via traces 22. Connectors $16_{G2}, 16_{G3}$ serve as gate connections for high side MOSFETs $T_2, T_3$.

Referring now to FIG. 5, second circuit board 14 includes drain conductive pads $20_{T1}, 20_{T2}, 20_{T3}$ for receiving drain contacts of high side MOSFETs $T_1, T_2, T_3$. Second circuit board 14 also includes interconnect conductive pads $28_{V+}$ and $28_{Vground}$. Drain conductive pads $20_{T1}, 20_{T2}, 20_{T3}$ are formed on the same conductive trace as interconnect conductive pads $28_{V+}$. Interconnect pads $28_{V+}$ are electrically connectable to interconnect pad $29_{V+}$ on first circuit board 12, which is electrically connected to external connector $16_{V+}$ via a trace 22. As a result drain contacts of high side MOSFET $T_1, T_2, T_3$ will be connected electrically to external connector $16_{V+}$. External connector $16_{V+}$ in the first embodiment of the present invention serves as the connection to the input power $V_+$, when second circuit board 14 is disposed over first circuit board 12.

Second circuit board 14 also includes gate conductive pads $24_{T4}, 24_{T5}, 24_{T6}$ for receiving gate contacts of low side MOSFETs $T_4, T_5, T_6$. Each gate conductive pad $24_{T4}, 24_{T5}, 24_{T6}$ is electrically connected to gate interconnect pads $28_{G4}, 28_{G5}, 28_{G6}$ via a respective trace 22. Each gate interconnect pad $28_{G4}, 28_{G5}, 28_{G6}$ is then connected to a corresponding gate interconnect pad $29_{G4}$, $29_{G5}$, $29_{G6}$ on first circuit board 12, and thereby electrically connected via a respective trace 22 to a corresponding gate connector $16_{G4}$, $16_{G5}$, $16_{G6}$.

Also disposed on second circuit board 14 are source conductive pads $18_{T4}$, $18_{T5}$, $18_{T6}$, and ground interconnect pads $28_{ground}$. Source conductive pads $18_{T4}$, $18_{T5}$, $18_{T6}$ and ground interconnect pads $28_{ground}$ are formed on a common conductive track and, therefore, are electrically connected together. Ground interconnect pads $28_{ground}$ on second circuit board 14 are connected to corresponding ground interconnect pads $29_{ground}$ on first circuit board 12, which are in turn connected via a common trace 32 to external ground connector $16_{ground}$. As a result, source contacts of low side MOSFETs $T_4$, $T_5$, $T_6$ are connectable to a ground connection via external connector $16_{ground}$.

Referring now to FIGS. 6 and 7, source contact, e.g. $ST_1$, of each high side MOSFET $T_1$, $T_2$, $T_3$ is electrically connected to a corresponding source conductive pad $18_{T1}$, $18_{T2}$, $18_{T3}$, and each gate contact, e.g. $GT_1$, of each high side MOSFET $T_1$, $T_2$, $T_3$ is electrically connected to a corresponding gate conductive pad $24_{T1}$, $24_{T2}$, $24_{T3}$. Also, each drain contact, e.g. $DT_6$, of each low side MOSFET $T_4$, $T_5$, $T_6$ is electrically connected to its corresponding drain conductive pad, e.g. $20_{T6}$, on first circuit board 12. Electrical connection in each case is made by a layer of conductive adhesive 33 such as solder or conductive epoxy. It should be noted that source contact and the gate contact of each MOSFET are exposed through a solder passivation 19 (shown by crossing lines in FIG. 6) layer which prevents the solder (or any other conductive adhesive) from shorting the gate contact to the source contact.

Referring now specifically to FIG. 7, second circuit board 14 is assembled opposite first circuit board 12 such that drain contact, e.g. $DT_1$ of each high side MOSFET $T_1$, $T_2$, $T_3$ is electrically connected via a layer of conductive adhesive 33 to its corresponding drain conductive pad, e.g. $20_{T1}$, on second circuit board 14. Similarly, source contact, e.g. $ST_6$, of each low side MOSFET $T_4$, $T_5$, $T_6$ is electrically connected via a layer of conductive adhesive 33 to its corresponding source conductive pad, e.g. $18T_6$ on second circuit board 14, and gate contact, e.g. $GT_6$, of each low side MOSFET, $T_4$, $T_5$, $T_6$, is electrically connected to its corresponding gate conductive pad, e.g. $24_{T6}$, via a layer of conductive adhesive 33.

Also shown in FIG. 7, is interconnect 35 which electrically connects ground conductive pad $29_{ground}$ on first circuit board 12 to ground conductive pad $28_{ground}$ on second circuit board 14. Interconnect 35 is connected to each conductive pad via a layer of conductive adhesive 33. Interconnect 35 may be any conductive body such as a copper slug.

FIG. 7 shows that low side MOSFET $T_6$, high side MOSFET $T_1$ and interconnect 35 are connected between first circuit board 12 and second circuit board 14. The remaining high side MOSFETs $T_2$, $T_3$ and low side MOSFETs $T_4$, $T_5$ are connected in the same manner as that of high side MOSFET $T_1$ and low side MOSFET $T_6$. Furthermore, interconnects are used to connect internal gate conductive pads $28_{G4}$, $28_{G5}$, $28_{G6}$ to internal conductive pads $29_{G4}$, $29_{G5}$, $29_{G6}$, and internal conductive pads $28_{V+}$ to conductive pads $29_{V+}$ in the same manner as described for interconnect 35 above.

Referring now to FIG. 8, once second circuit board 14 is assembled over first circuit board 12, an epoxy underfilling 37 is provided in the spaces between first circuit board 12 and second circuit board 14. The purpose of epoxy underfilling 37 is to protect MOSFETs from environmental conditions such as moisture. As shown by FIG. 8, a heatsink 40 may be thermally coupled to second circuit board 14 to assist in heat dissipation. Heatsink 40 may also be coupled to first circuit board 12 without deviating from the present invention.

Each circuit board 12, 14 may receive a heatsink to effect double-sided cooling. Advantageously, because of double-sided cooling, smaller heatsinks can be used (instead of one large heatsink) thereby reducing the overall size of the package.

Referring now to FIGS. 9A-9D, semiconductor package 10 is manufactured according to the following process. First, solder paste (shown by slanted lines) or some other conductive adhesive is printed on the conductive pads on first circuit board 12. Next, as illustrated by FIG. 9B, high side MOSFETs $T_1$, $T_2$, $T_3$ and low side MOSFETs $T_4$, $T_5$, $T_6$ are placed on their respective positions on first circuit board 12. Thereafter, as illustrated by FIG. 9C, solder paste (shown by slanted lines) or some other conductive adhesive is printed on the conductive pads on second circuit board 14, and, as shown by FIG. 9D, second circuit board 14 is placed over first circuit and then the entire structure is heated to cause the solder paste to be reflown. Thereafter, epoxy is disposed to fill the space between first circuit board 12 and second circuit board 14.

A plurality of first circuit boards 12 may be linked together to form a large panel and MOSFETs $T_1$, $T_2$, $T_3$, $T_4$, $T_5$, $T_6$ and second circuit boards 14 may be placed by a pick-and-place machine. Then, first circuit boards 12 are cut from the large panel to form individual packages after epoxy underfilling has been applied.

A multi-chip package according to the present invention includes several improvements to the package described above with reference to FIG. 1-9.

A package according to the present invention, for example, includes a metallic body extending over preferably the entire free surface of one of the two circuit boards. Furthermore, a package according to the present invention includes at least one external connector which is raised to be coplanar with the metallic body. The external connector may be a copper slug which is electrically connected to a respective conductive track on one of the circuit boards. In one preferred embodiment a package according to the present invention includes elements of only a single half bridge.

A package according to the present invention may further include a dielectric underfilling disposed between the circuit boards and around the semiconductor devices disposed therebetween.

To optimize the performance of a package according to the present invention at least one of the semiconductor devices contained therein may be rectangular (rather than square) with a long and thin aspect ratio in order to a) minimize adverse thermal characteristics;

b) increase switching speed;

c) max out the solderable area to further improved thermal performance.

A package according to the present invention may be further improved by using a monolithic integrated MOSFET and schottky component, instead of a packaged device containing a discreet MOSFET and a discreet schottky.

Other features and advantages of the present invention will become apparent from the following description of the invention which refers to the accompanying drawings.

DETAILED DESCRIPTION OF THE FIGURES

Figure 1:
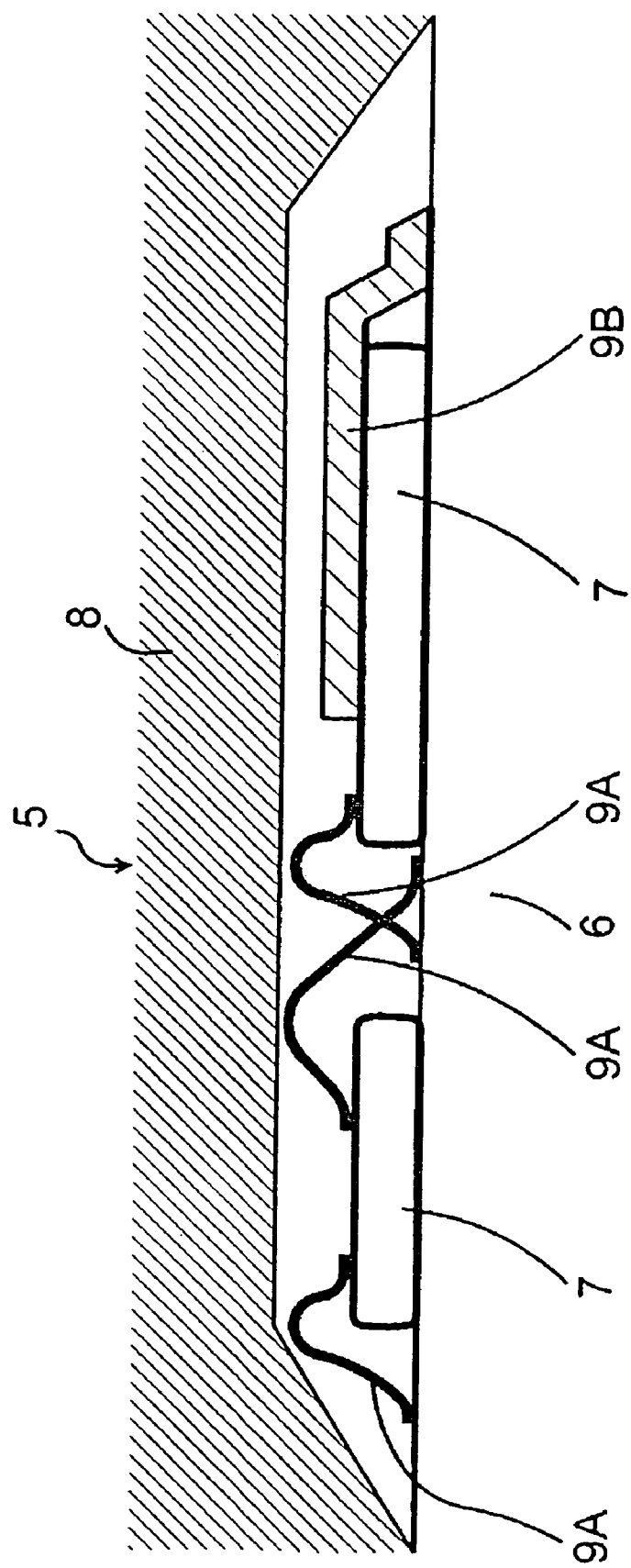
FIG. 1 shows a cross-sectional view of a semiconductor package according to the prior art.
Figure 2:
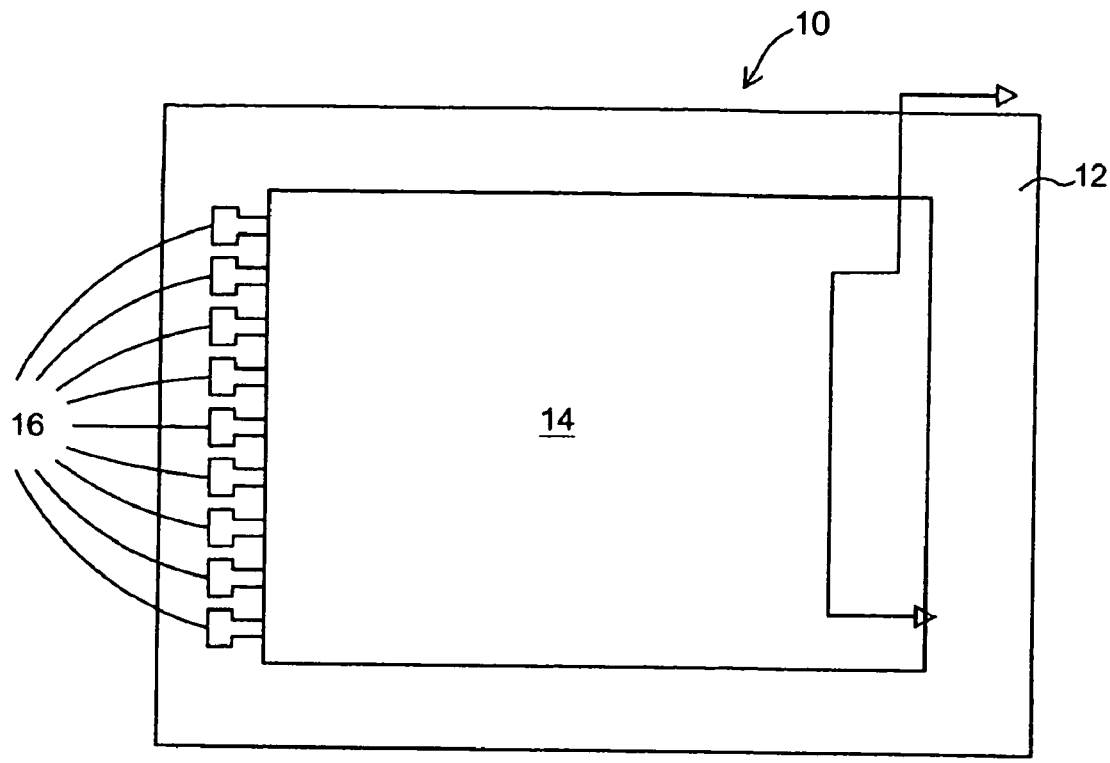
FIG. 2 shows the top plan view of a semiconductor package according to the prior art.
Figure 3:
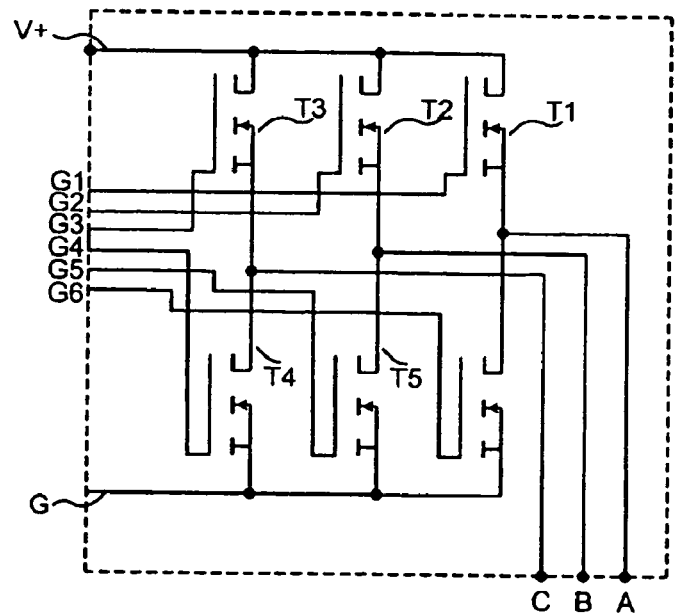
FIG. 3 shows the circuit diagram for the components disposed within a package according to FIG. 2.
Figure 5:
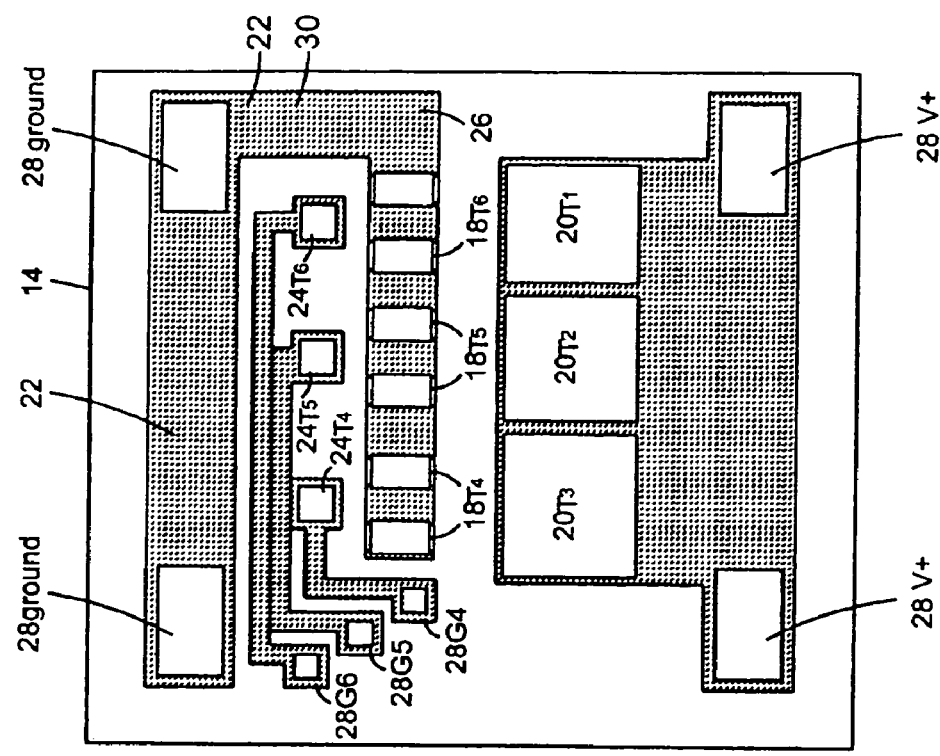
FIG. 5 shows a top plan view of another circuit board used in a package according to the prior art.
Figure 4:
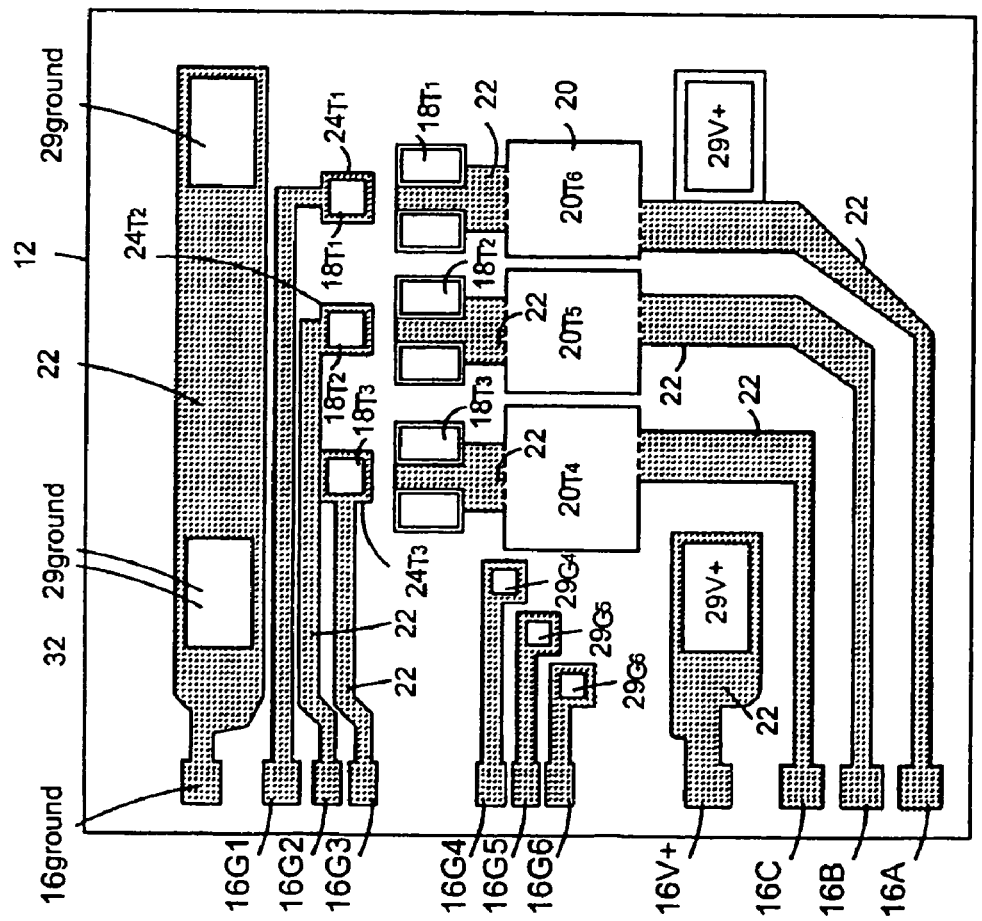
FIG. 4 shows a top plan view of a circuit board used in a package according to the prior art.
Figure 6:
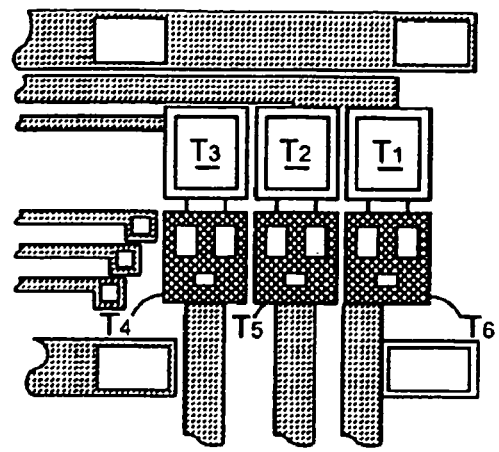
FIG. 6 shows a top plan view of the circuit board shown by FIG. 4 which includes a plurality of semiconductor switching devices.
Figure 7:
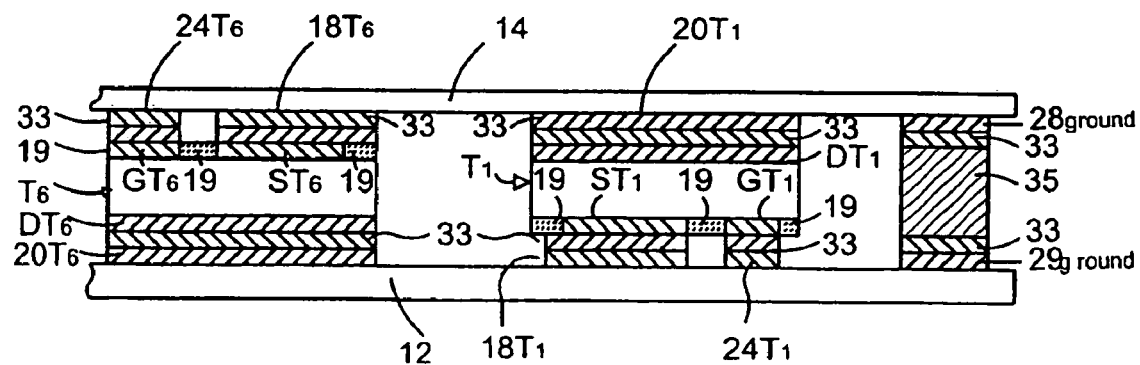
FIG. 7 shows a cross-sectional view of a package taken along line 7-7 in FIG. 2 viewed in the direction of the arrows.
Figure 8:
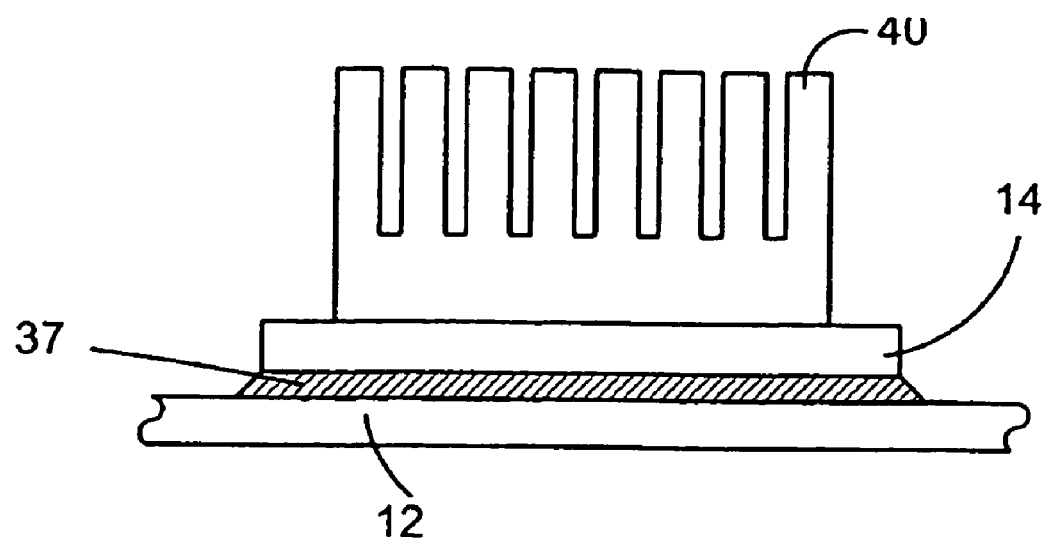
FIG. 8 shows a side view of a package according to the prior art which has a heatsink mounted on one side thereof.
Figure 9A:
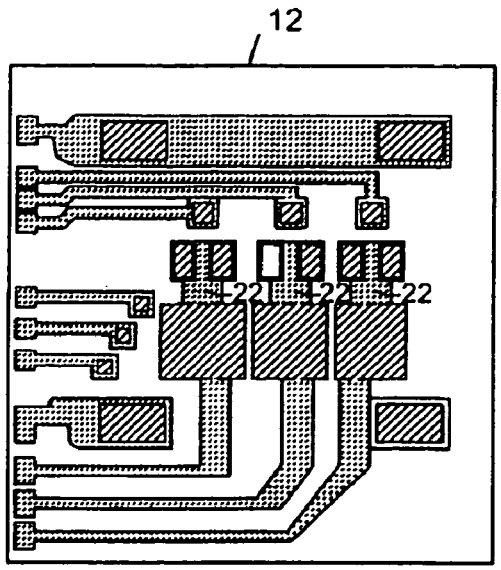
FIGS. 9A-9D illustrate the processing steps taken for the manufacture of a package according to the prior art.
Figure 9B:
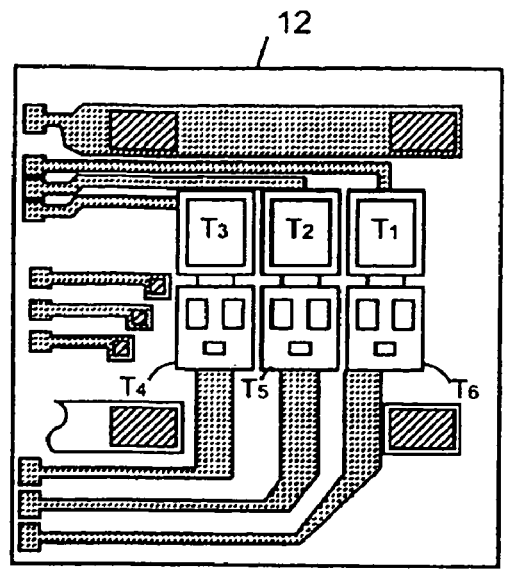
Figure 9C:
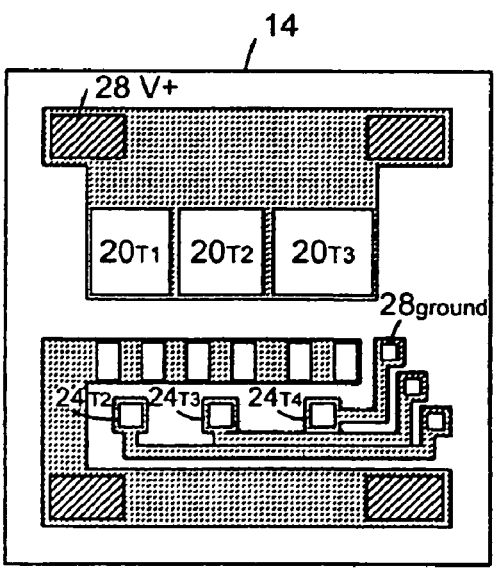
Figure 9D:
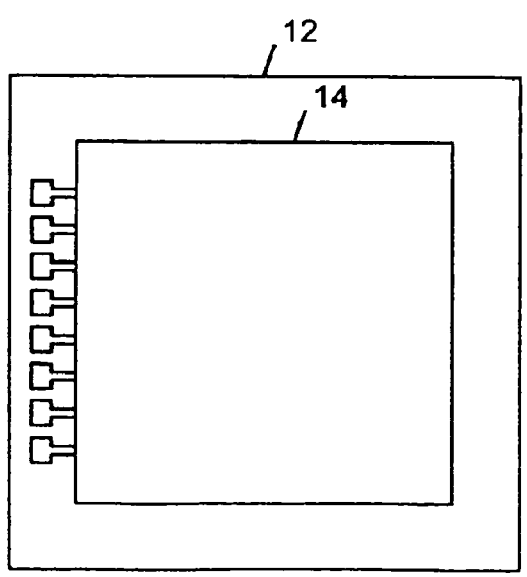
Figure 10:
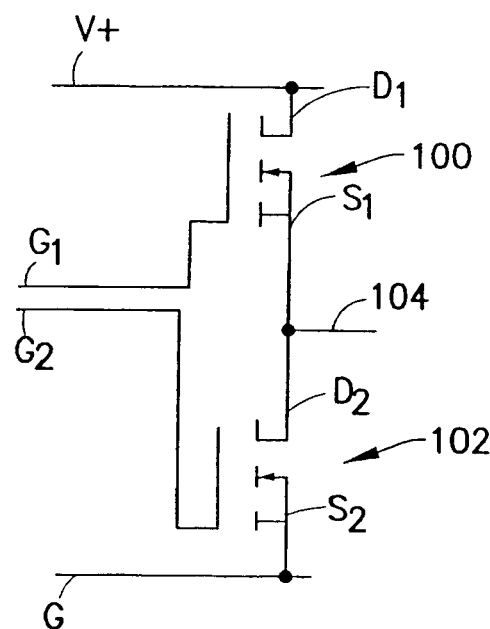
FIG. 10 illustrates a circuit diagram for a single half-bridge.

A package according to the preferred embodiment of the present invention includes only a single (as opposed to several) half-bridge circuit elements. Referring to FIG. 10, a single half-bridge includes a high side switch 100 and a low side switch 102. Preferably, switches 100, 102 are N-channel MOSFETs each including a gate electrode $G_1$, $G_2$, a source electrode $S_1$, $S_2$ and a drain electrode $D_1$, $D_2$. To form a half-bridge, drain electrode $D_2$ of low side MOSFET 102 is connected to source electrode $S_1$ of high side MOSFET 100, drain electrode $D_1$ of high side MOSFET 100 is connected to the power input $V_+$ and source electrode $S_2$ of low side MOSFET 102 is connected to the ground G. As is well known, the output 104 may be taken from the connection point of low side MOSFET 102 and high side MOSFET 100. The half-bridge circuit in a package according to the present invention may be used for controlling power that is fed to, for example, a phase of a motor, or the half-bridge may be configured to serve in the power stage of a power converter, such as a buck converter. When used in a buck converter or the like high side MOSFET 100 may be configured to serve as the control switch and low side MOSFET 102 may be configured to serve as the synchronous switch.

Figure 11:
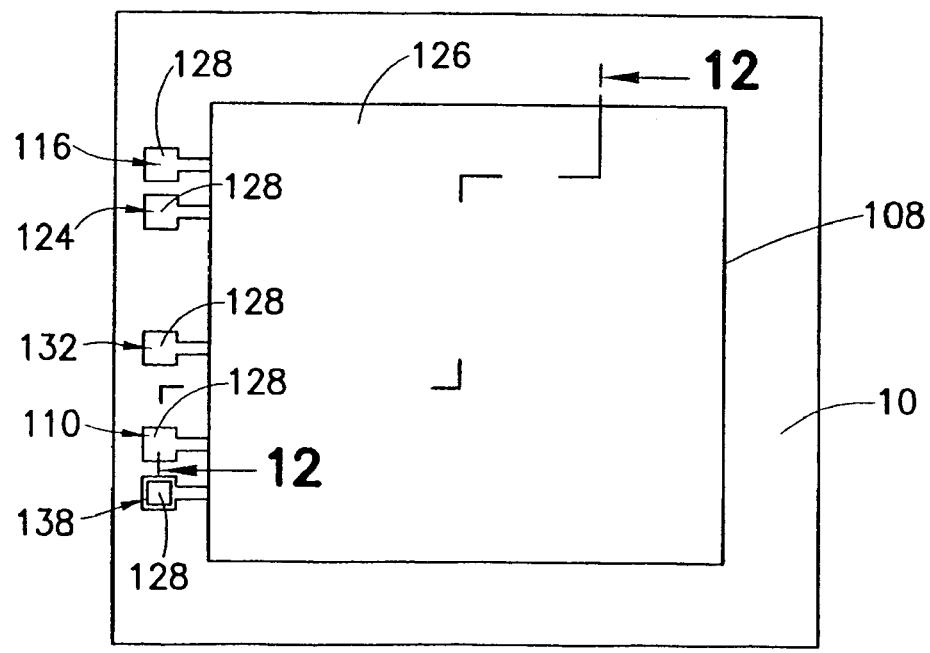
FIG. 11 shows a top plan view of a package according to the present invention.
Figure 12:
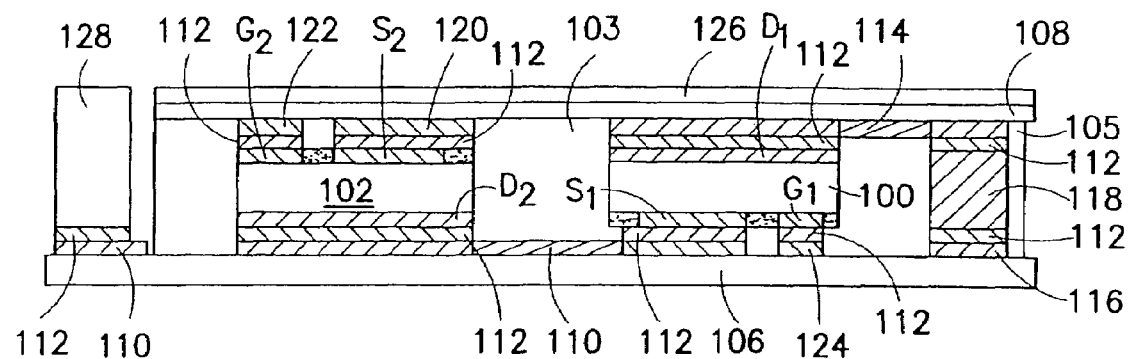
FIG. 12 shows a cross-sectional view of a package according to the present invention along line 12-12 viewed in the direction of the arrows.

Referring now to FIGS. 11 and 12, a package according to the present invention includes a first circuit board 106, and a second circuit board 108. Each circuit board 106, 108 may be an IMS, DBC or the like material. To enhance thermal performance, circuit boards comprising of AlSiC or Cu—Mo—Cu may be used. Circuit board 106 includes one conductive track 110 which electrically connects source electrode $S_1$ of high side MOSFET 102. Specifically, source electrode $S_1$ is electrically and mechanically coupled to conductive track 110 through a conductive adhesive body 112, and drain electrode $D_2$ is electrically and mechanically coupled to track 110 through another conductive adhesive body 112. Conductive adhesive body 112 as referred to herein may be solder or a conductive epoxy or the like.

Circuit board 108 also includes a conductive track 114 which is electrically and mechanically coupled to drain electrode $D_1$ of MOSFET 100 through a conductive adhesive body 112. Track 114 is in turn connected to conductive track 116 on circuit board 106 through an interconnect 118, which may be a metallic slug, e.g. a copper slug. Note that a conductive adhesive is also used to couple interconnect 118 between track 114, 116. Further note that track 116 is for receiving power input $V_+$.

Source electrode $S_2$ and gate electrode $G_2$ are both electrically connected to respective tracks 120, and track 122 by a conductive adhesive body 112. Gate electrode $G_1$ is also electrically connected to respective conductive track 124 through a conductive adhesive body 112.

Track 110, which serves to connect source electrode $S_1$ and drain electrode $D_2$, serves as the output node 104 of the half-bridge.

According to one aspect of the invention, circuit board 108 includes a metallic body 126 (e.g. copper) spread across preferably the entire exterior surface thereof. Metallic body 126 can serve as a heat spreader, or it may be a base for thermal connection to a heatsink or the like body.

According to another aspect of the present invention, each track includes a metallic connector 128, which serves as a lead connected to the end thereof. Metallic connector 128 may be formed of copper or a copper alloy, and is electrically and mechanically coupled to a respective track using a conductive adhesive body 112. Note that the free end of connector 128 is coplanar with metallic body 126 on circuit board 108. Thus, together, when a package according to the present invention is mounted on a circuit board or the like connectors 128 can be connected to respective pads on the circuit board, while metallic body 126 can be thermally connected to for example a heatsink or the like embedded in the circuit board.

Note that in one preferred embodiment a dielectric underfilling 103 may be disposed between circuit boards 106, 108 and around MOSFETs 100, 102. Dielectric underfilling 103 may be a conductive epoxy or the like material, and can be used to improve the thermal performance of the package, protect the die, and improve the mechanical integrity of the package.

Figure 13A:
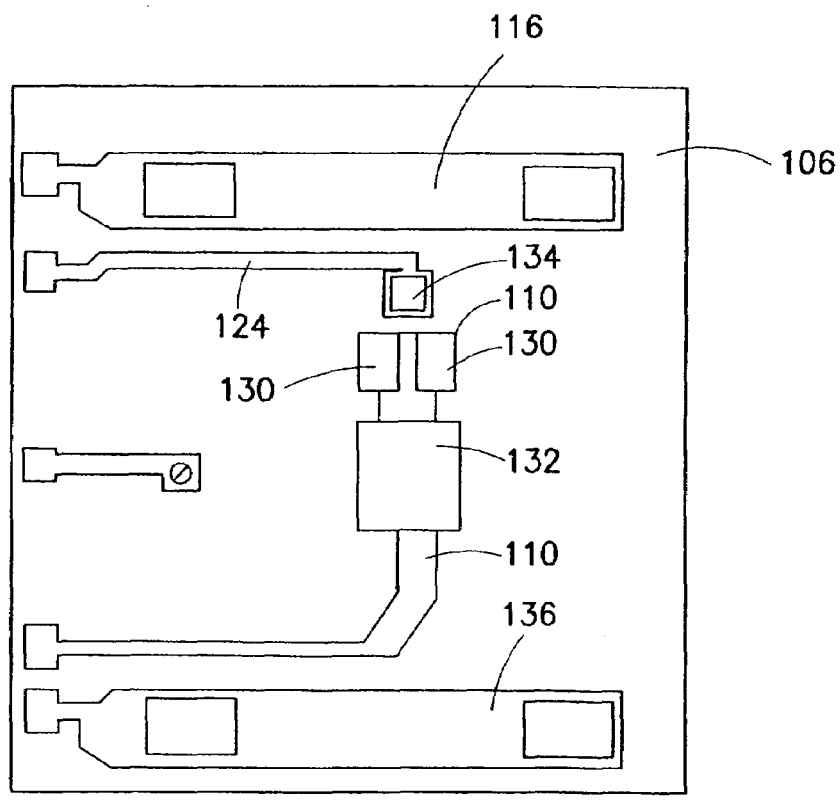
FIGS. 13A-13C illustrate selected steps in the assembly of a package according to the present invention.
Figure 13B:
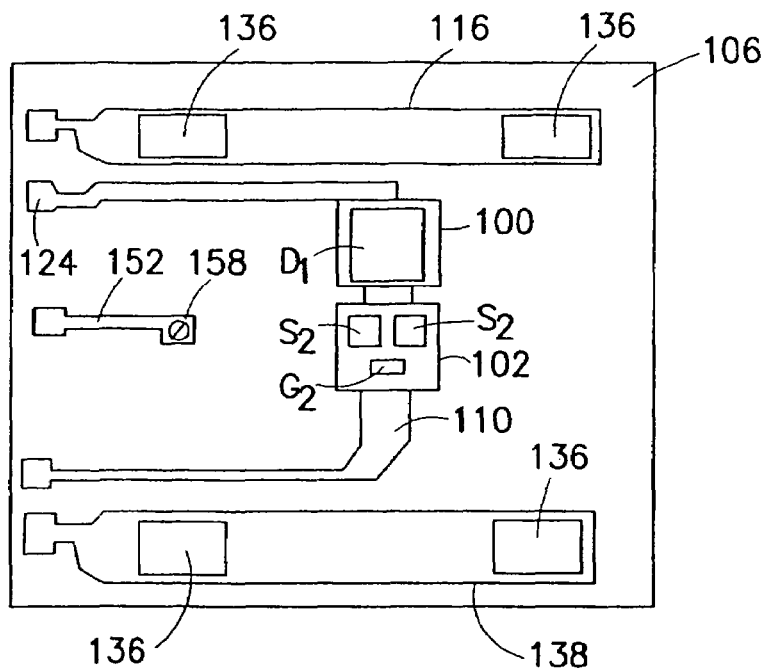
Figure 13C:
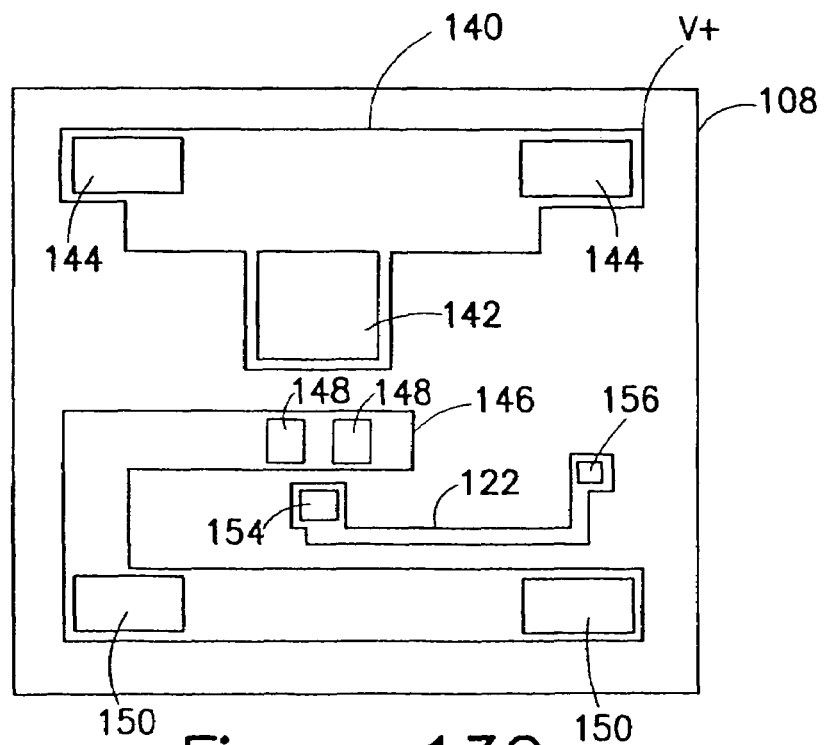

Referring now to FIGS. 13A-13C, to fabricate a package according to the present invention source $S_1$ of high side MOSFET 100 is disposed over receiving areas 130 of track 110, and drain electrode $D_2$ of low side MOSFET 102 is disposed over receiving area 132 of track 110. Note that a conductive adhesive may be pre-applied to either electrodes $S_1$, $D_2$ or to receiving areas 130, 132 before the disposition of the MOSFETs thereon. Similarly, gate electrode $G_1$ is disposed over receiving area 134 of track 124, with a conductive adhesive either pre-applied to the gate electrode or the receiving area 134. Note also that (although not shown specifically) at this stage dielectric underfilling 103 may be applied around MOSFETs 100, 102. The result is shown by FIG. 13B.

Next, interconnects 118 may be disposed over respective receiving areas 136 of tracks 116, 138. Note that track 138 will serve to connect the ground to source electrode $S_2$. Note also that a conductive adhesive is applied between each interconnect 118 and a receiving area 136. Thereafter, circuit board 108 is assembled. Specifically, circuit board 108 includes track 140 which includes area 142 for electrical connection to drain $D_1$ and receiving areas 144 for electrical connection to interconnects 118 that are disposed over receiving areas 136 on track 138. Circuit board 108 further includes track 146. Track 146 includes receiving areas 148 for connection to source electrodes S$_2$, and receiving areas 150 for electrical connection to interconnects 118 that are disposed over receiving areas 136 of track 138. Furthermore, circuit board 108 includes track 122 which include a receiving area 154 for electrical connection to gate electrode G$_2$. Track 152 includes a connection area 156 which is electrically connected to the connection surface 158 of track 152 on circuit board 106. Electrical connection in each instance may be realized through a conductive adhesive.

Note that connectors 126 may be electrically and mechanically coupled to respective tracks as described above to realize a package according to the present invention. The following table discloses the designation for each track.

| TRACK | DESIGNATION |
|-------|-------------|
| 152   | G$_2$       |
| 124   | G$_1$       |
| 138   | G (ground)  |
| 110   | 104 (output)|
| 116   | V$_+$ (input)|

Figure 14:
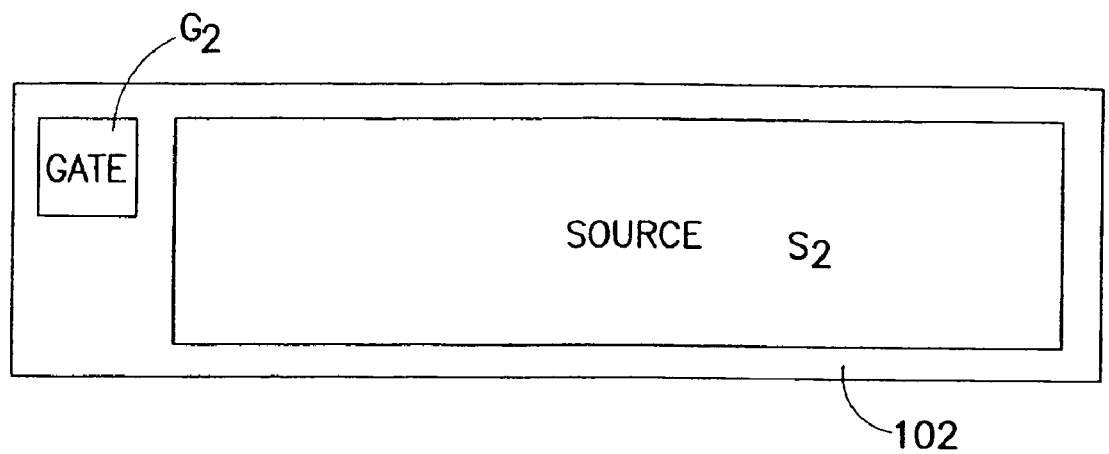
FIG. 14 shows a top plan view of a novel semiconductor device configuration that may be used in an embodiment of the present invention.

Referring now to FIG. 14, according to another embodiment, one of said MOSFETs 100, 102, or both can be rectangular (having a length that is longer than a width thereof) as opposed to being square (which is the conventional configuration). Thus, for example, when the package is a half-bridge, low side MOSFET 102 may be rectangular, or when the package includes a half-bridge for a buck converter MOSFET 102, which serves as the synchronous FET, may be rectangular. Note that the use of a rectangular MOSFET is not limited to a single half-bridge/single phase package. Rather, such a die may be used in a multi-phase package according to the prior art as described herein.

Figure 15:
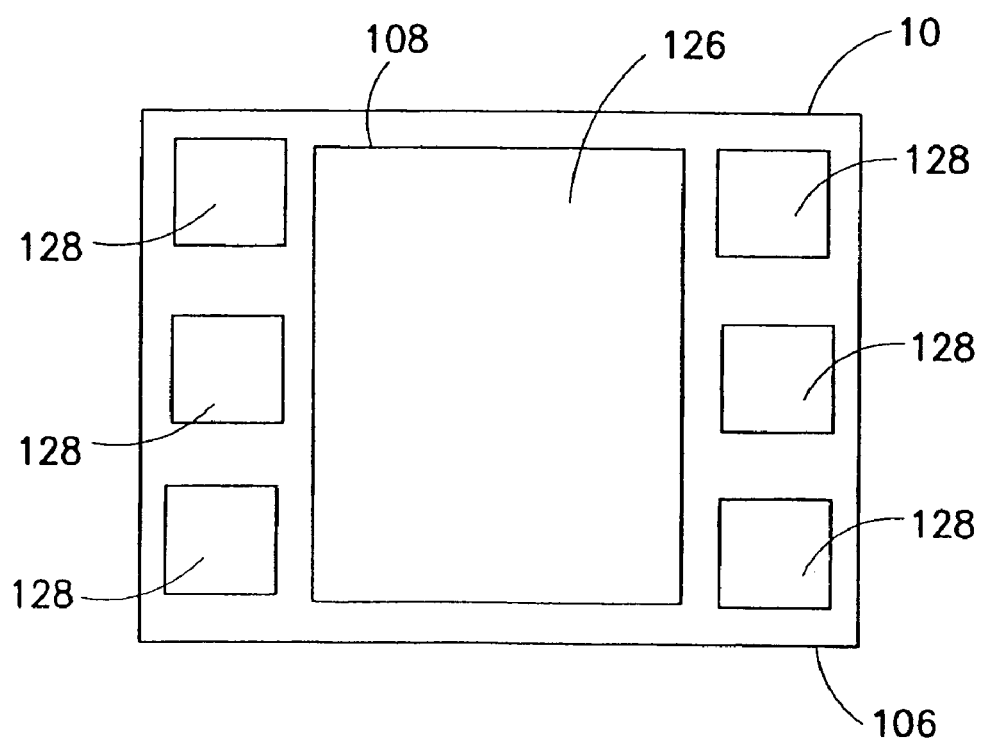
FIG. 15 shows a top plan view of a package according to another embodiment of the present invention.

Referring now to FIG. 15, in another embodiment of the present invention, connectors 128 may be disposed at opposing edges of circuit board 106, instead of being disposed at one edge thereof. Such an arrangement may further render stability to the package when it is surface mounted.

In all the embodiments disclosed herein an IC, and passive components may be integrated with the power MOSFETs between the two circuit boards to obtain a multi-chip fully integrated power module assembly.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A semiconductor package comprising:
a first thermally conductive substrate including a plurality of conductive tracks disposed on a first major surface thereof, and a flat metallic body covering a second opposing major surface thereof, said flat metallic body including a first surface on said first thermally conductive substrate and a second flat surface opposite to and spaced from said first surface thereof;
a second thermally conductive substrate including a plurality of conductive tracks disposed on a first major surface thereof;
first and second power semiconductor devices each including a first power contact on a first major surface thereof, a second power contact and a control contact on a second opposing major surface thereof;
a first layer of conductive adhesive interposed between, and mechanically connected to, a first power contact of each power semiconductor device and a respective conductive track on said first thermally conductive substrate, a second layer of conductive adhesive interposed between, and mechanically connected to a second power contact of each power semiconductor device and a respective conductive track on said second thermally conductive substrate;
a third layer of conductive adhesive interposed between, and mechanically connected to, a control contact of each power semiconductor device and a respective conductive track, wherein said first power electrode of said first power semiconductor device and said second power electrode of said second power semiconductor device are electrically connected to one another through at least one of said conductive tracks; and
a plurality of metallic connectors each connected electrically and mechanically at one end thereof through a conductive adhesive body to a respective one of said tracks and coplanar at another opposing end thereof with said second flat surface of said flat metallic body, wherein said metallic connectors serve as leads for said semiconductor package.

2. The semiconductor package of claim 1, wherein each substrate is an IMS.

3. The semiconductor package of claim 1, wherein each substrate is a DBC.

4. The semiconductor package of claim 1, wherein each substrate is comprised of AlSiC.

5. The semiconductor package of claim 1, wherein each substrate is comprised of Cu—Mo—Cu.

6. The semiconductor package of claim 1, wherein at least one of said power semiconductor devices is rectangular.

7. The semiconductor package of claim 1, wherein said connectors are arranged at one edge of one of said substrates.

8. The semiconductor package of claim 1, wherein said connectors are arranged at two opposing edges of one of said substrates.

9. The semiconductor package of claim 1, wherein said semiconductor devices form a single half-bridge.

10. The semiconductor package of claim 1, wherein said semiconductor devices form the switching circuit of a buck converter.

11. The semiconductor package of claim 1, further comprising a dielectric underfilling disposed between said first and second substrates.

12. The semiconductor package of claim 11, wherein said dielectric underfilling comprises an epoxy.

13. The semiconductor package of claim 11, wherein said dielectric underfilling is disposed around said first and said second power semiconductor devices.

14. The semiconductor package of claim 1, wherein each said metallic connector comprises a metallic slug.

15. The semiconductor package of claim 1, wherein each said metallic connector comprises a copper slug.

* * * * *